United States Patent [19]

Kumaoka et al.

[11] 4,245,349

[45] Jan. 13, 1981

[54] AUTOMATIC FREQUENCY SCANNING RADIO RECEIVER

[75] Inventors: Michiaki Kumaoka; Sinzi Aosima, both of Shizuoka, Japan

[73] Assignee: Nippon Gakki Seizo Kabushiki Kaisha, Hamamatsu, Japan

[21] Appl. No.: 973,631

[22] Filed: Dec. 27, 1978

[30] Foreign Application Priority Data

Dec. 29, 1977 [JP] Japan .............................. 52-160009
Jan. 9, 1978 [JP] Japan ................................ 53-975[u]
Jan. 25, 1978 [JP] Japan ................................. 53-6849
Jan. 25, 1978 [JP] Japan ................................. 53-6850

[51] Int. Cl.$^3$ ............................................ H03J 7/28
[52] U.S. Cl. ..................................... 455/165; 455/194
[58] Field of Search ...................... 325/469, 470, 335; 358/193, 193.1; 455/161, 164, 194, 165, 169, 147

[56] References Cited

U.S. PATENT DOCUMENTS

| | | | |
|---|---|---|---|
| 3,803,494 | 4/1974 | Howell et al. | 325/469 |
| 3,845,394 | 10/1974 | Hamada | 325/470 |
| 3,961,261 | 6/1976 | Pflasterer | 325/335 |
| 4,027,251 | 5/1977 | Fathauer et al. | 325/470 |
| 4,081,752 | 3/1978 | Sumi | 325/470 |
| 4,156,196 | 5/1979 | Someno et al. | 455/169 |

OTHER PUBLICATIONS

Heath's Digital F.M. Tuner –David M. Thomas, May 1973, Radio Electronics, pp. 42–45, 50, 93

Primary Examiner—Marc E. Bookbinder
Attorney, Agent, or Firm—Frishauf, Holtz, Goodman & Woodward

[57] ABSTRACT

An automatic frequency scanning radio receiver which includes a phase-locked loop frequency synthesizer serving as a local oscillator circuit and a scan clock counter circuit to produce a program input signal. The program input signal is supplied to a programmable divide-by-N counter of the frequency synthesizer, whereby the frequency synthesizer has its output frequency automatically changed in steps to automatically scan channels within a desired received frequency band. A detection circuit is provided for detecting a tuning of the radio receiver to a broadcast signal above a predetermined input level on one channel, whereby scan clock counting of the scan clock counter circuit, or the automatic channel scanning is interrupted when the radio receiver is tuned to such a broadcast signal. The tuning detection circuit detects whether or not the receiver is tuned to a broadcast signal having an input level above the predetermined input level in response to a noise level and a DC voltage level indicating a tuning degree of the receiver at the output of a demodulator such as a frequency discriminator.

7 Claims, 6 Drawing Figures

AUTO SCANNER 25

AUTOMATIC FREQUENCY SCANNING RADIO RECEIVER

BACKGROUND OF THE INVENTION

This invention relates to a radio receiver, and more particularly to an automatic frequency scanning radio receiver.

As automatic frequency scanning radio receivers that automatically scan a plurality of channels within a predetermined radio frequency band to automatically select a radio frequency broadcast signal on one channel, there are known those receivers which employ a phase-locked loop frequency synthesizer as a local oscillator circuit. Such phase-locked loop frequency synthesizer comprises a voltage-controlled oscillator (VCO), a divide-by-N counter for dividing the output frequency of VCO, a phase comparator for detecting the phase difference between an output signal of the counter and a reference frequency signal, and a loop filter coupling a DC voltage having a magnitude corresponding to the phase difference between the input signals of the phase comparator to VCO as a control signal. For the divide-by-N counter, there is used a programmable counter capable of designating a dividing factor N by means of a program input signal or station select signal, whereby the output frequency of the frequency synthesizer or local oscillator frequency may be specified. In other words, when a specific number (dividing factor) is designated by the program input signal, a channel corresponding to the designated number is selected to receive a broadcast signal on the channel.

When the dividing factor N is automatically changed in integral steps by the program input signal, the frequency synthesizer has its output frequency automatically changed in steps at predetermined frequency spaces to scan channels automatically. As the program input signal for the automatic scanning, there are usually used outputs of scan counters for counting clock pulses with a sufficiently low frequency.

In the prior art automatic frequency scanning radio receivers as described above, the received frequency (dividing factor) is displayed on a display device during the automatic scanning. When the displayed value attains a desired broadcasting frequency, a scanning stop switch is operated to interrupt the automatic scanning. Since the output frequency of the synthesizer varies constantly during the automatic scanning, it is difficult to stop the scanning exactly at the desired frequency. Therefore, a fine tuning adjustment is essential after the automatic scanning is stopped. Moreover, in the conventional radio receivers, there is provided a one-step scanning switch for performing a step-by-step manual scanning. To perform the manual scanning by means of the one-step scanning switch the above-mentioned automatic scannning stop switch must be operated to interrupt the automatic scanning once. That is, these conventional automatic scanning radio receivers are subject to a disadvantage; the operation for the automatic selection of station and the like are troublesome.

SUMMARY OF THE INVENTION

An object of this invention is to provide an improved automatic frequency scanning radio receiver which is easy in operation.

Another object of the invention is to provide an improved automatic frequency scanning radio receiver which is simple in construction.

Still another object of the invention is to provide an improved automatic frequency scanning radio receiver in which an automatic frequency scanning is automatically stopped when the receiver is tuned to a broadcast signal with a predetermined input level.

According to this invention, an automatic frequency scanning radio receiver which includes a local oscillator circuit, such as a phase-locked loop frequency synthesizer, having its output frequency automatically varied in steps in response to a select signal, thereby automatically scanning channels, and a scan clock counter circuit for counting scan clocks to supply the select signal to the local oscillator circuit, is characterized by provisions of a tuning detection circuit for detecting a tuning of the radio receiver to a broadcast signal with an input level above a predetermined level on a channel during the automatic scanning, and circuit means for automatically interrupting counting operation of the scan clock counter circuit when the receiver is tuned to such a broadcast signal in response to the tuning detection circuit.

The tuning detection circuit is connected to a demodulator such as a frequency discriminator and so arranged as to detect whether or not the receiver is tuned to the broadcast signal in response to a noise level and a DC voltage level indicating the tuning degree of the receiver at the output of the demodulator. The noise level can be made variable at which the tuning detection circuit interrupts the automatic scanning or counting operation of the scan clock counter circuit. In order to interrupt the counting operation of the scan clock counter circuit, a scan clock generator may be disabled from generating clocks by the tuning detection circuit.

A provision is made to preset the scan counter, when a power supply switch is turned on, at such a count number as to set the output frequency of the local oscillator circuit to a predetermined frequency within a desired frequency range, thereby allowing the automatic frequency scanning to be started at such predetermined frequency within the received frequency band.

Furthermore, there are provided switches for one-step manual scanning and a control circuit connected to these switches. The control circuit is so arranged as to interrupt the counting operation of the scan clock counter and to change the count number in the scan counter by one step when each of the switches is operated, thereby obviating the necessity of the provision of an automatic scanning stop switch.

DETAILED DESCRIPTION OF THE PREFERRED EMBODIMENT

Figure 1:
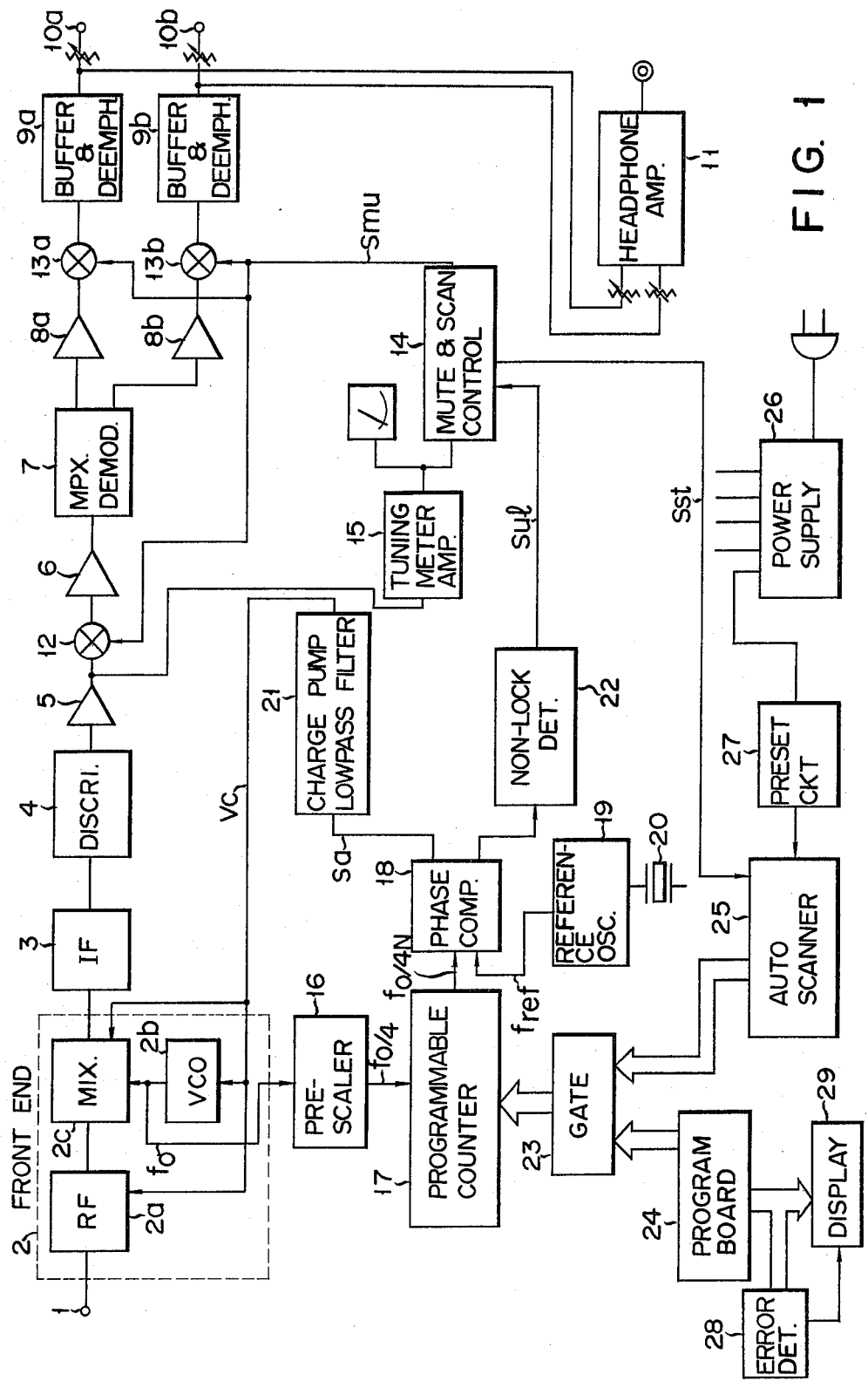
FIG. 1 is a block diagram of an automatic frequency scanning radio receiver according to an embodiment of this invention.

In FIG. 1 showing a block diagram of the proposed automatic frequency scanning FM stereo tuner or receiver, an incoming FM stereo broadcast signal is applied from an antenna input terminal 1 to a front end 2 comprised of a radio frequency amplifier 2a, a voltage-controlled oscillator (VCO) 2b and a mixer 2c where an amplified radio frequency signal from the amplifier 2a and an output signal of VCO 2b are mixed to produce an intermediate-frequency FM signal centered at 10.7 MHz. The intermediate-frequency FM signal is amplified by an intermediate-frequency amplifier 3 and then applied to a frequency discriminator 4 to recover a stereo composite signal from a frequency-modulated signal. The composite signal is applied through amplifiers 5 and 6 to a multiplex demodulator 7 where left and right stereophonic audio signals are demodulated. The left audio signal is applied through an amplifier 8a and a buffer and deemphasis circuit 9a to a left output terminal 10a, while the right audio signal is applied through an amplifier 8b and a buffer and deemphasis circuit 9b to a right output terminal 10b. The output signals of the deemphasis circuits 9a and 9b are also applied to a headphone amplifier 11. In the arrangement of FIG. 1, mute gate circuits 12, 13a and 13b are provided between the amplifiers 5 and 6, between the amplifier 8a and the deemphasis circuit 9a, and between the amplifier 8b and the deemphasis circuit 9b, respectively. The mute gate circuits 12, 13a and 13b are controlled by a mute signal Smu from a mute and scan control circuit 14 to interrupt the signal transmission paths, thereby muting audio outputs.

The mute and scan control circuit 14 is connected to a tuning meter amplifier 15 which is connected to the output side of the frequency discriminator 4 and detects a tuning condition of the tuner in accordance with the well-known S-shaped response of the frequency discriminator 4 and the level of noises in the output signal of the discriminator 4. The control circuit 14 disables, therefore, the mute gates 12, 13a and 13b when the tuner is tuned to a broadcast signal whose input level is above a predetermined level, and enables the mute agates 12, 13a and 13b to mute audio outputs when the tuner is tuned out or the input level is below the predetermined level even if the tuner is tuned. The control circuit 14 is also so constructed as to produce the mute signal Smu in response to a non-lock signal Sul from a non-lock detector 12 which represents the state that a phase-locked loop frequency synthesizer as described later is not in lock, and to produce a station signal Sst representing that the tuner is tuned to a broadcast signal whose input level is above the predetermined level when the mute signal Smu is not produced.

With FM tuners used in Japan, VCO 2b is so designed that, since the intermediate frequency is 10.7 MHz and the local oscillator frequency is 10.7 MHz lower than a received FM broadcast frequency, its output frequency can be made variable from 65.3 MHz to 79.7 MHz in accordance with the voltage level of a control signal Vc applied thereto to receive FM broadcast signals within the allocated FM broadcast frequency band of 76.0 MHz to 90.0 MHz. On the other hand, in the U.S.A., since the local oscillator frequency is selected to be 10.7 MHz higher than a received FM broadcast frequency, VCO 2b is so designed as to produce output frequencies ranging from 98.7 MHz to 118.7 MHz to meet the assigned frequency band of 88 MHz to 108 MHz.

The description hereunder is made on a receiver suited for using in such a counting as adopting the lower local oscillation frequency and the FM broadcast frequency band of 76.0 MHz to 90.0 MHz.

The output frequency of VCO 2b is divided by a factor of four, for example, by a prescaler 16, and the output frequency (fo/4) of the prescaler 16 is further divided by a programmable counter or divide-by-N counter 17 which is a down counter whose preset value $N_p$ can be changed by a station select signal or program input signal externally applied thereto. More specifically, the programmable counter 17 is so designed as to produce one output pulse each time it counts the output pulses of the prescaler 16 by a number (N) which is set by a program input, thereby dividing the output frequency (fo/4) of the prescaler 16 by a factor of N. The variable range of the dividing factor or divisor N of the programmable counter 17 may be set to 653 to 797 so that the output frequency of the programmable counter 17 may become 25 KHz when the phase-locked loop is in lock.

In practice, however, since it is convenient for a user of the receiver that the preset values $N_p$ from the program input signal are provided by numbers 760 to 900 directly corresponding to received frequencies of 76.0 MHz to 90.0 MHz, the programmable counter 17 is so constructed as to produce one output pulse each time the counter 17 is counted from the preset value $N_p$ down to a down-count limit value No of 107 corresponding to the intermediate frequency of 10.7 MHz, while returning to the preset value $N_p$ to repeat downcounting.

The output signal with the frequency fo/4N is applied to a phase comparator 18 to be compared with a reference signal fref of 25 kHz from a reference oscillator 19. The reference oscillator 19 is arranged to produce the 25 kHz reference signal by dividing by 256 the oscillation frequency of 6.4 MHz determined by a crystal element 20.

An output signal Sa of the phase comparator 18 is applied to a charge pump and lowpass filter 21 which supplies VCO 2b with the control signal Vc the voltage level of which depends on the phase difference between the two input signals applied to the phase comparator 18. The control signal Vc is supplied also to tuning elements in the radio frequency amplifier 2a and the mixer circuit 2c to control the tuning frequency. VCO 2b, prescaler 16, programmable counter 17, phase comparator 18 and loop filter 21 constitute the phase-locked loop frequency synthesizer. The output frequency fo of VCO 2b is controlled by the control signal Vc so that the phase difference between the input signals of the phase comparator 18 becomes zero, in other words, the output frequency fo/4N of the programmable counter 17 becomes 25 KHz, the reference frequency. It will be evident, therefore, that the output frequency fo of VCO 2b or frequency synthesizer becomes 4N.25 kHz = N.100 kHz in the stable condition of phase-locked loop. Accordingly, by changing in integral steps the preset value Np over the range of 760 to 900, that is, the dividing factor N of the programmable counter 17 over the range of 653 to 797, the output frequency of VCO 2b or local oscillator frequency can be changed in steps equal to four times the reference frequency fref, that is, 100 kHz, thereby allowing the automatic scanning of a plurality of channels having a channel space of 100 kHz over the frequency band of 76.0 MHz to 90.0 MHz. In the U.S.A., the channel space is selected to be 200 kHz. Accordingly, in order to allow automatic scanning of channels spaced 200 kHz apart over the frequency band of 88.0 MHz to 108.0 MHz, the output frequency fref of the reference oscillator 19 in the arrangement of FIG. 1 may be selected at 50 kHz. Alternatively, the dividing factor of the prescaler 16 may be set to 8.

Connected to the phase comparator 18 is the above-mentioned non-lock detector 22 which detects the state in which the phase of the output signal of the programmable counter 17 does not coincide with that of the reference signal from the reference oscillator 19, in other words, the unstable state of the phase-locked loop to produce the non-lock detection signal Sul which is applied to the mute gates 12, 13a and 13b to interrupt the signal transmission paths.

The programmable counter 17 is supplied with the station select signal or program input signal through a gate circuit 23 from a program board 24 or an auto scanner 25. The program board 24 is so arranged as to produce a code signal, like the select signal, representing the number corresponding to a desired received signal (for example, when the desired received frequency is 85.0 MHz, the code number is set at 850) by a manual operation.

The auto scanner 25, which is the vital constituent element of this invention as described later, is so arranged as to produce code signals whose code numbers change in integral steps over a range of numbers corresponding to received frequencies of, for example, 760 to 900, at a cycle period of a clock pulse signal whose frequency is, for example, 30 Hz which is much lower than the output frequency (25 kHz) of the programmable counter 17. Namely, the preset number Np of the programmable counter 17 is changed or scanned step by step by the code signals from the auto scanner 25 at a time interval of 1/30 second during which the phase-locked loop frequency synthesizer is made stable. Accordingly, when the code number provided by the auto scanner 25 increases, the received frequencies are scanned in the up direction, whereas, when the code number decreases, the received frequencies are scanned in the down direction.

The gate circuit 23 is so constructed as to selectively couple the outputs of the program board 24 and the auto scanner 25 to the programmable counter 17 by an external operation.

Connected to the auto scanner 25 is a preset circuit 27 which presets the auto scanner 25 at a number (e.g., 800) corresponding to a predetermined frequency (80.0 MHz) within the received frequency band as an initial value for the auto scanning when a power supply 26 is turned on. The auto scanner 25 is so constructed as to interrupt the auto scanning in response to the station signal Sst from the mute and scan control circuit 14 representing reception of a broadcast signal above the predeteremined input level, and to continue the reception of the broadcast signal. A program error detecting circuit 28, which is connected to the program board 24, detects an errorneous setting of received frequencies outside the broadcasting frequency band, and a display device 29 displays the set frequency and program error.

Figure 2:
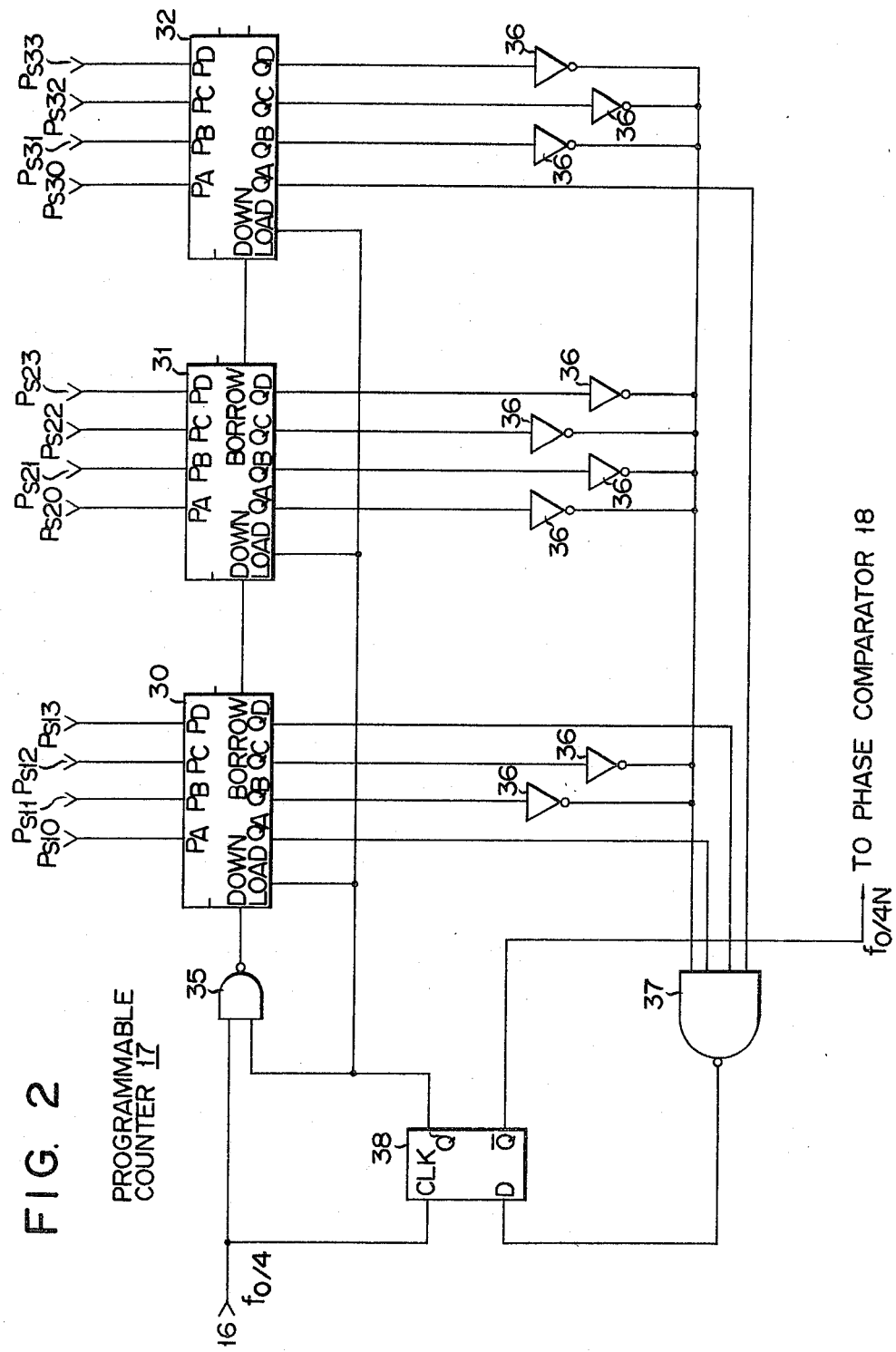
FIG. 2 shows the arrangement of a programmable counter of FIG. 1.

In FIG. 2 showing an example of the arrangement of the programmable counter 17, reference numerals 30, 31 and 32 denote presettable decade counters. In this embodiment, as these decade counters, synchronous up/down and asynchronously presettable BCD decade counters, such as Texas Instruments "SN 74192" IC counters are used. The down-count input of the first-stage counter 30 is connected to the output of prescaler 16 through a NAND gate 35, while the borrow-output is connected to the down-count input of the second-stage counter 31. The borrow output of the second-stage counter 31 is connected to the down-count input of the third-stage counter 32. Accordingly, the count number of the first-stage counter 30 corresponds to a number of the order of 0.1 MHz of a received frequency; the count numbers of the second- and third-stage counters 31 and 32 to numbers of the orders of 1 MHz and 10 MHz, respectively. Preset inputs PA ($2^0$), PB ($2^1$), PC ($2^2$) and PD ($2^3$) of the counters 30, 31 and 32 are coupled with BCD code outputs Ps10 to Ps13, Ps20 to Ps23 and Ps30 to Ps33 from the auto scanner 25 or program board 24, respectively. These counters are preset when the LOAD terminal is at a low level.

Code output terminals QA ($2^0$), QB ($2^1$), QC ($2^2$) and QD ($2^3$) of each counter are connected to a NAND gate 37 directly or through inverters 36 in accordance with a predetermined connective relation. The predetermined connective relation is such that all the inputs of NAND gate 37 go high when the count number of counters 30, 31 and 32 becomes "109", the down-count limit value. The output of NAND gate 37 is connected to the data input D of a positive edge triggered type-D flip-flop circuit 38. The clock input CLK of the flip-flop circuit 38 is supplied with the output signal of the prescaler 16. The flip-flop has one output Q connected to the NAND gate 35 and the LOAD terminals of the counters 30, 31 and 32, and the other output $\overline{Q}$ to the phase comparator 18.

In the programmable counter 17 of the above-mentioned arrangement, the output of NAND gate 37 normally remains high, and thus the output Q of the flip-flop circuit 38 is also high, so that the NAND gate 35 is enabled and the counters 30, 31 and 32 are enabled to count input pulses. The counters 30, 31 and 32 have their preset value counted down by the output signal of the prescaler 16 supplied through the enabled NAND gate 35. When the count number becomes 109, the output of NAND gate 37, that is, the data input D of the flip-flop circuit 38 turns low. Accordingly, the output Q of flip-flop circuit 38 turns from the high to low level in response to the first rising edge of the input pulse after negative transition of the data input D. In consequence, the LOAD terminals of the counters 30, 31 and 32 change from the high to low level, so that the preset data (e.g., 850) is loaded into the counters 30, 31 and 32. Since the output of NAND gate 35 is kept high at this point of time, the counting operation is interrupted. As a result of the presetting of the counters 30, 31 and 32, the counter outputs change from "109" to "850", so that the output of NAND gate 37 returns to the high level. In response to the first rising edge of the input pulse after positive transition of the output of NAND gate 37, the output Q of the flip-flop circuit 38 changes from the low to high level. Consequently, the NAND gate 35 is enabled to start down-counting of the counters 30, 31 and 32 from the preset value. Thereafter, the same processes are repeated in succession.

In the programmable counter 17, there exists a propagating delay time of associated elements from a time when the count number of counters 30, 31 and 32 becomes "109" to a time when these counters are preset and the NAND gate 35 is enabled. Such delay time is substantially equivalent to two periods of the output pulse of the prescaler 16 supplied to the clock input CLK of the flip-flop circuit 38. Although the down-count limit value No is set at 109, the programmable counter 17 may, therefore, be considered to be so constructed that the count number may return to the preset value the moment the counter 17 has its count number counted down to "107". That is, the programmable counter 17 delivers one output pulse from the output $\overline{Q}$ of the flip-flop circuit 38 to the phase comparator 18 each time it counts the output pulses of the prescaler 16 by the number which is equal to the preset value Np minus the limit value No (107). This means that the programmable counter 17 divides the output signal of the prescaler 16 by a factor $N=Np-107$. It is evident that the dividing factor N can be varied by changing the preset value Np.

Figure 3A:
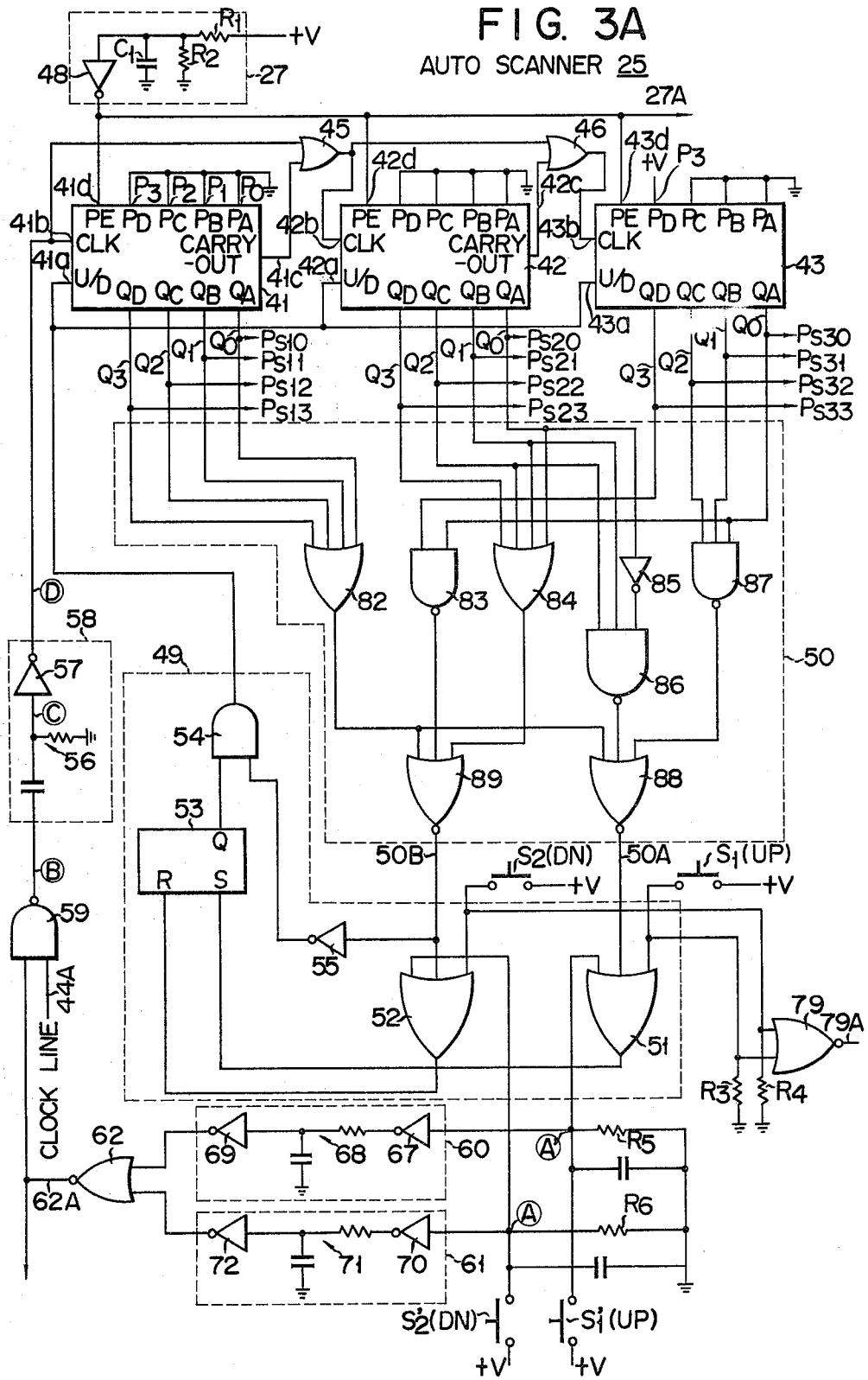
FIGS. 3A shows a scan counter and its peripheral circuits included in an auto scanner of FIG. 1.
Figure 3B:
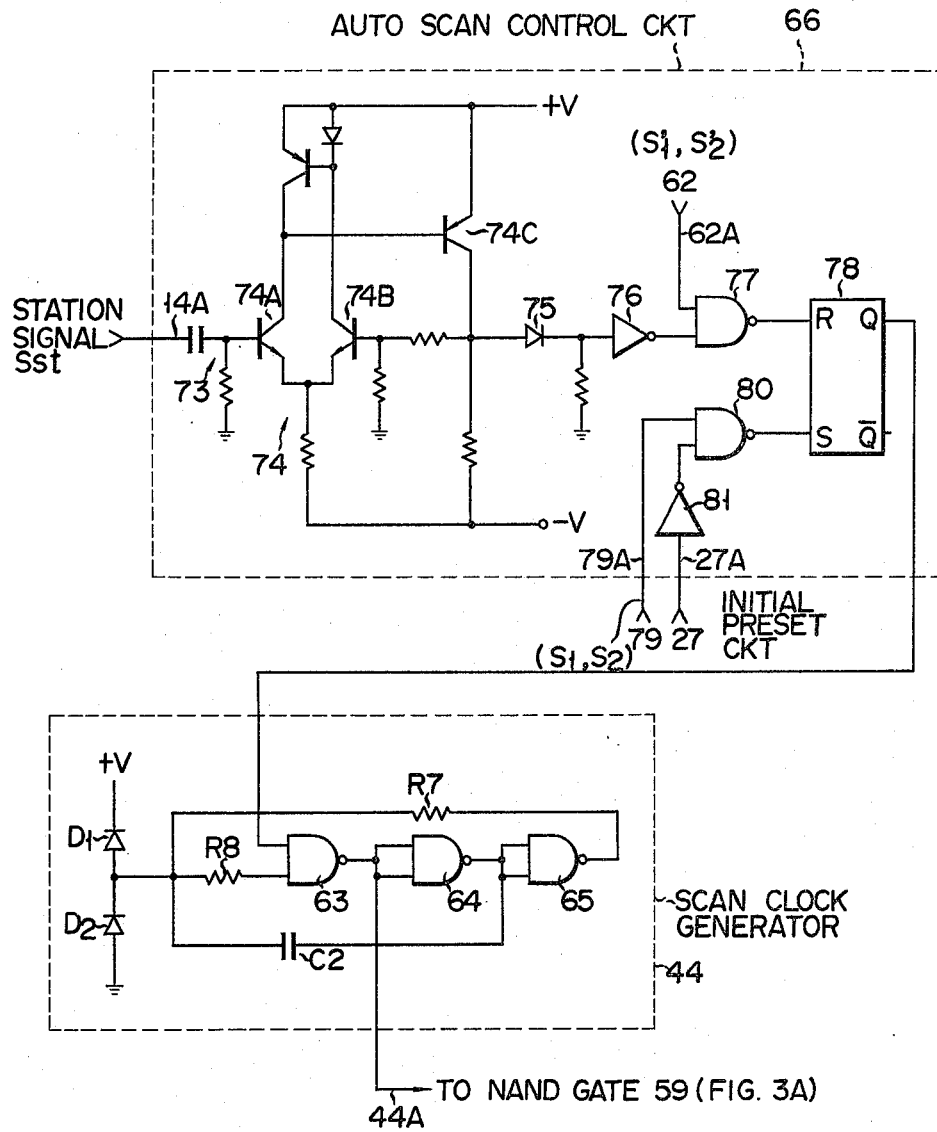
FIG. 3B shows an auto scan control circuit and a scan clock pulse generator included in the auto scanner of FIG. 1.

Referring now to FIGS. 3A and 3B, there will be described practical arrangements of the auto scanner 25 and preset control circuit 27. Counters 41, 42 and 43 are adapted to produce BCD code select signals for varying or scanning the preset value Np of the programmable counter 17. In this embodiment, those counters used are presettable BCD decade counters, such as Motorola "MC 14510" IC counters, whose count direction or counter state is controlled by a common control terminal. The operating conditions of this type of counter are as follows:

(a) Up-counting and down-counting are performed with the control signals of the up/down control terminals 41a, 42a and 43a at high- and low-levels, respectively.

(b) Positive transitions of clock input signals of clock input terminals 41b, 42b and 43b from the low- to high-level are counted.

(c) The outputs of carry-out terminals 41c, 42c and 43 are low only when the count number is "9" in the up-count state, going high at other numbers, while they are low only when the count number is "0" in the down-count state, otherwise going high.

(d) Counter outputs at code output terminals Q0 ($2^0$), Q1 ($2^1$), Q2 ($2^2$) and Q3 ($2^3$) are taken off in positive logic system.

(e) When preset enable signals at preset enable terminals 41d, 42d and 43d are high, positive logic data at preset data terminals P0 ($2^0$), P1 ($2^1$), P2 ($2^2$) and P3 ($2^3$) are preset in the counters.

The counter 41 is adapted to count units numbers of a three-digit decimal number, while the counters 42 and 43 are adapted to count tens and hundreds numbers respectively. Unlike a conventional counter connection configuration, the connection configuration of this invention is such that the clock input and carry-out terminals of the first-stage counter 41 are connected to the clock input terminal of the second-stage counter 42 through an OR gate 45, while the clock input and carry-out terminals of the second-stage counter 42 are connected to the clock input terminal of the third- or final-stage counter 43 through an OR gate 46. In the conventional counter connection, the carry-out terminal of a counter is directly connected to the clock input terminal of the immediately succeeding counter.

The preset data terminal P3 ($2^3$) of the third-stage counter 43 is connected to a supply voltage +V, and the remaining data terminals of the counter 43 and all the preset data terminals of the other counters 41 and 42 are connected to ground. Therefore, the preset value of this embodiment is "800". The preset enable terminals 41d, 42d and 43d of counters 41, 42 and 43 are connected to the output of the preset control circuit 27 comprised of resistors R1 and R2, a capacitor C1 and an inverter 48 with a Schmitt circuit configuration, and having its input connected to the power supply (+V). The preset control circuit 27 sets the preset enable terminals temporarily to the high level when the power is switched on, presetting the preset data "800" in the counters 41, 42 and 43.

The up/down control terminals 41a, 42a and 43a of the counters 41, 42 and 43 are connected to an up/down control circuit 49 comprised of OR gates 51 and 52, an inverter 55, an R-S flip-flop circuit 53, and an AND gate 54. The control circuit 49 is adapted to control the counting direction of the counters 41, 42 and 43 in response to up/down automatic scan control switches S1 and S2, up/down scan control switches S'1 and S'2, and a lower and upper limit number detection circuit 50. The OR gate 51 has inputs connected to the first and third switches S1 and S'1 and a lower limit number detection output line 50A of the detection circuit 50, and an output connected to the set input S of the flip-flop circuit 53. The OR gate 52 has inputs connected to the second and fourth switches S2 and S'2 and an upper limit number detection output line 50B of the detection circuit 50, and an output connected to the reset input R of the flip-flop circuit 53. The output Q of the flip-flop circuit 53 is connected to one input of the AND gate 54 the other input of which is connected to the upper limit number detection output line 50B through the inverter 55. The output of AND gate 54 is connected to the up/down control terminals 41a, 42a and 43a of the counters 41, 42 and 43. The first to fourth switches S1, S2, S'1 and S'2 are of a normally open type. The first and second switches S1 and S2 have the ends connected to the power supply +V and the other ends, which are connected to the OR gate inputs, connected to ground through resistors R3 and R4, respectively. When operated, therefore, they coupled a high-level (+V) control signal to the OR gates 51 and 52. The third and fourth switches S'1 and S'2 have the ends connected to the power supply +V and the other ends, which are connected to the OR gate input, connected to ground through resistors R5 and R6, respectively, thereby coupling a high-level (+V) control signal to the OR gates 51 and 52 when operated. The outputs of the first and second switches S1 and S2 are connected to a NOR gate 79, whose output 79A is coupled to an auto scan control circuit 66 of FIG. 3B. The output 79A is at the high level when neither of the first and second switches S1 and S2 is operated.

The clock input terminal 41b of the scan counter 41 is connected with the output of an edge detection circuit 58 comprised of a differentiation circuit 56 and an inverter 57, the input of the differentiation circuit 56 being connected with the output of a NAND gate 59. The NAND gate 59 has one input terminal connected to a clock output line 44A of a scan clock pulse generator circuit 44 as shown in FIG. 3B and the other input terminal connected to an output terminal 62A of a NOR gate 62. Inputs of the NOR gate 62 are connected to the third and fourth switches S'1 and S'2 through delay circuits 60 and 61, respectively. The output 62A of the NOR gate 62 is at the high level when neither of the third and fourth switches S'1 and S'2 is operated.

The scan clock generator 44, as shown in FIG. 3B, is formed of an astable multivibrator comprising a NAND gate 63, NAND gates 64 and 65 each having two inputs connected together to act as an inverter, resistors R7 and R8, and a capacitor C2. The frequency of the astable multivibrator 44, which is determined by the values of the resistor R7 and capacitor C2, is 30 Hz much lower than the output frequency (25 kHz) of the programmable counter 17, according to this embodiment. Diodes D1 and D2 and the resistor R8 are intended for protection of the NAND gate 63 against any overvoltage input when the astable multivibrator operates. The clock output line 44A is connected from the output of NAND gate 63 to the NAND gate 59. One input of the NAND gate 63 is connected with the auto scan control circuit 66, as described later, for controlling operation of the scan clock pulse generator circuit 44.

The above-mentioned delay circuit 60 (FIG. 3A) is comprised of inverters 67 and 69 with a Schmitt circuit configuration and an integration circuit 68 connected between these inverters. Likewise, the delay circuit 61 is comprised of Schmitt circuit type inverters 70 and 72 and an integration circuit 71. These delay circuits 60 and 61 tends to delay the output signals of the third and fourth switches S'1 and S'2 by a predetermined period of time, and is adapted to remove effects of chattering caused by switching operation of S'1 and S'2 on the counter 42.

The auto scan control circuit 66 (FIG. 3B) controls the operation of the scan clock generator 44 in response to the station signal Sst from the mute and scan control circuit 14, a control signal produced by operation of the up/down automatic scan control switch S1 or S2, a control signal produced by operation of the up/down one-step control switch S'1 or S'2, and the control signal from the preset control circuit 27. In the auto scan control circuit 66, a station signal line 14A of the mute control circuit 14 is connected to an integration circuit 73, the output of which is connected to a non-inverting amplifier 74 comprised of transistors 74A and 74B connected in a differential configuration and a succeeding amplifying transistor 74C. The output of the amplifier 74 is coupled to one input of a NAND gate 77 through a diode 75 and a Schmitt circuit type inverter 76 for wave shaping, the other input of the NAND gate 77 being connected to the output terminal of the NOR gate 62 (FIG. 3A), that is, one-step scan signal line 62A. The output of NAND gate 77 is coupled to the reset input of a flip-flop circuit 78. The set input of the flip-flop circuit 78 is connected to the output of a NAND gate 80 one input of which is connected with the output 79A of the NOR gate 79 (FIG. 3A) having two inputs connected to the outputs of first and second control switches S1 and S2. The other input of NAND gate 80 is connected to an output line 27A of the initial preset control circuit 27 through an inverter 81. The output Q of the flip-flop circuit 78 is coupled to one input of the NAND gate 63 of the scan clock generator circuit 44.

The lower and upper limit number detection circuit 50 (FIG. 3A) is adapted to allow the scan counters 41, 42 and 43 to count only within a range corresponding to a predetermined received frequency range, for example, 760 to 900. That is, the detection circuit 50 detects the upper limit value (900) to reverse the count direction of the scan counters in the case of up-counting, while it detects the lower limit value (760) to change the count direction in the case of down-counting. The detection circuit 50 includes an OR gate 82, NAND gate 83, OR gate 84, inverter 85, and NAND gates 86 and 87 connected to the code output terminals Q0, Q1, Q2 and Q3 of the counters 41, 42 and 43 in accordance with the predetermined connective relation as illustrated. Inputs of a lower limit value detection NOR gate 88 are connected to the OR gate 82 and NAND gates 86 and 87, producing a high-level signal on the output line 50A when the count number in the scan counters reaches the lower limit number (760). An upper limit value detection NOR gate 89, having its inputs connected to the outputs of the OR gates 82 and 84 and NAND gate 83, produces a high-level signal on the output line 50B when the count number in the scan counters attains 900.

Now there will be described the function and operation of the auto scanner 25 and the preset control circuit 27 constructed in the aforesaid manner.

Upon turning the power supply on, the voltage of the capacitor C1 of the initial preset control circuit 27, that is, the input voltage of the inverter 48 increases gradually. The output voltage of the inverter 48 is at the high level before its input voltage exceeds its threshold voltage. When the input voltage exceeds the threshold voltage, the output voltage of the inverter 48 goes low. Accordingly, the preset enable terminals 41d, 42d and 43d of the scan counters 41, 42 and 43 are temporarily maintained at the high level by switching the power supply on, so that the scan counters are preset at the predetermined number (800). The preset number in the scan counters is further presetted into the programmable counter of FIG. 2 through the code output lines Ps10 to Ps13, Ps20 to Ps23, and Ps30 to Ps33.

Since the output line 27A of the preset control circuit 27 is coupled to the inverter 81 of the auto scan control circuit 66, the output of NAND gate 80 goes high when the power supply is switched on, thereby setting the flip-flop circuit 78. In response to the high-level output Q of the flip-flop circuit, the NAND gate 63 of the scan clock pulse generator 44 is enabled to cause the generator 44 to start oscillation at 30 Hz. The scan clock pulses are supplied to the clock input of the first-stage counter 41 through the edge detection circuit 58, since the output of the NOR gate 62 is high and the NAND gate 59 is enabled at this point of time (when neither of the switches S'1 and S'2 is operated). Counting of the scan clock pulses starts after the preset enable terminal or the output of the preset control circuit 27 is changed to the low level. The edge detection 58 has no influence upon the scan clock counting of the scan counters. The reason why the edge detection circuit 58 is provided will be described later.

At the time of presetting the scan counters 41, 42 and 43, the outputs of OR gates 51 and 52 of the up/down control circuit 49 or the reset and set inputs of the flip-flop circuit 53 are both at the low level. Therefore, the state of the output Q of the flip-flop circuit 53 is not defined. The upper limit number detection line 50B is at the low level, and thence the output of the inverter 55 is at the high level, so that the AND gate 54 is enabled. Thus, the voltage level of the up/down control terminals 41a, 42a and 43a of the scan counters 41, 42 and 43 depends on the state of the output Q of the flip-flop circuit 53, and the count direction of the scan counters 41, 42 and 43, therefore, is indefinite. That is, at the point of time when the scan counters are preset, the count direction of the scan counters is not specified.

By the scan clock counting in the up or down direction of the scan counters, the code outputs of the scan counters are changed to vary the preset value in the programmable counter 17 from the initial preset value (800) in the up or down direction. Consequently, the output frequency of the phase-locked loop frequency synthesizer changes at intervals of 100kHz so that a plurality of channels spaced 100 kHz apart are scanned. According to this invention, the scan starting frequency is selected at a predetermined one within the received frequency band. In this embodiment employing the received frequency band of 76.0 MHz to 90.0 MHz, the scan starting frequency is set at 80.0 MHz.

When a high-intensity broadcast signal is received on one channel during the automatic scanning of the frequency synthesizer, the potential at the station signal line 14A from the muting and scan control circuit 14 changes from the low to high level to develop the station signal Sst. The station signal Sst is differentiated by the differentiation circuit 73 of the auto scan control circuit 66, and then amplified by the noninverting amplifier 74. A positive-going output pulse of the amplifier 74 is inverted by the inverter 76, thereby developing a positive-going pulse at the output of NAND gate 77 and resetting the flip-flop circuit 78. Since, at this point of time, the output line 27A of the preset control circuit 27 is at the low level, the set input of the flip-flop circuit 78 is at the low level. As a result of the resetting of the flip-flop circuit 78, the NAND gate 63 of the scan clock pulse generator 44 is disabled, interrupting the generation of the scan clock pulses. The output of the NAND gate 63 or the clock output line 44A is maintained at the high level. Accordingly, the operation of the scan counters 41, 42 and 43 are stopped, and the count number therein stays at a value corresponding to the received frequency, so that tuning of the radio receiver to the received frequency may be kept.

In resuming the auto scan from the interrupted state to receive another broadcast signal, it is only necessary that the auto scan control switch S1 or S2 be operated. If the auto scan control switch S1 is operated, the output of the OR gate 51 goes high to set the flip-flop circuit 53, that is, to render the output Q of the flip-flop circuit 53 high. Unless the count number in the scan counter corresponds to the maximum frequency (90.0 MHz) of the received frequency band, the upper limit number detection line 50B is at the low level, so that the output of the inverter 55 is at the high level. Accordingly, the output of the AND gate 54 goes high, allowing the counters 41, 42 and 43 to act as up counters. Since operation of the auto scan control switch brings the output 79A of the NOR gate 79 to the low level, the output of the NAND gate 80 of the auto scan control circuit 66 goes high, setting the flip-flop circuit 78. As a result of the setting of the flipflop 78, the NAND gate 63 is enabled so that the scan clock pulse generator 44 produces scan clock pulses. Namely, if the first auto scan control switch S1 is operated when the count number in the scan counters 41, 42 and 43 is not the upper limit number, the count number in the scan counters is automatically increased from the count number at the time when the auto scan is interrupted.

On the other hand, if the second switch S2 is operated, the output of the OR gate 52 goes high to reset the flip-flop circuit 53, that is, to turn the output Q of the flip-flop circuit 53 to the low level. In consequence, the output of the AND gate 54 is rendered low, causing the scan counters to act as down counters. At the same time, as is the case with the operation of the first swich S1, the output of NOR gate 79 becomes low to enable the scan clock pulse generator 44 to produce scan clock pulses.

As may be clear from the above description, the auto scan direction may be controlled by operation of the auto scan control switch S1 or S2. If a high-intensity broadcast signal is received during automatic scanning after the switch is operated, the auto scan is interrupted, as already described. When the count number in the scan counters reaches the upper limit number without receiving any high-intensity broadcast signals during the up count operation, the signal line 50B and hence the output of the OR gate 52 goes high to reset the flip-flop circuit 53. As a result, the output of the AND gate 54 goes low to reverse the count direction or frequency scanning direction of the scan counters. On the other hand, when the counter number in the scan counters reaches the lower limit number, the output line 50A of the NAND gate 88 and thence the output of the OR gate 51 turns to the high level to set the flip-flop circuit 53. At this time, the output 50B of the NAND gate 89 is low, so that the output of the inverter 55 is high. Accordingly, as a result of the setting of the flip-flop circuit 53, the output of AND gate 54 goes high, reversing the count direction of the scan counters from down to up.

In the up/down control circuit 49, the AND gate 54 is provided for the following reason. The operation of the auto scan control switch S1, as stated above, increases the count number in the scan counters. When the count number reaches the upper limit number while the switch S1 is being operated, that is, while the set input of the flip-flop circuit 53 is at the high level, the output of the OR gate 52 or the reset input of the flip-flop circuit 53 goes high, though the output Q of the flip-flop circuit 53 makes no change. However, the output of the inverter 55 turns to the low level so that the output of the AND gate 54 goes low to change the counting direction of the scan counters from up to down. That is, without the AND gate 54, the scan counters would go on up-counting after the upper limit number is reached. When the count number in the scan counters reaches the lower limit number while the second switch S2 is being operated, the counting direction of the scan counters is automatically switched from down to up by operation of the flip-flop circuit 53 itself without regard to the AND gate 54.

Now there will be described operation by the onestep control switches S'1 and S'2. Since the output of the switch S'1, as well as the output of the switch S1, is coupled to the OR gate 51, and the output of the switch S'2 is coupled to the OR gate 52 together with the output of the switch S2, it is evident that operation of the switch S'1 will cause the scan counters to count up and that operation of the switch S'2 will cause the scan counters to count down.

A positive-going operation signal lasting during the operation of the switch S'1 is delayed by the delay circuit 60, and thus a delayed negative-going operation signal is taken off from the NOR gate 62. Similarly, in the case of operating the switch S'2, a negative-going operation signal delayed by the delay circuit 61 is taken off from the NOR gate 62. The negative-going operation signal produced by operation of the switch S'1 or S'2 is coupled to the NAND gate 77 of the auto scan control circuit 66, resetting the flip-flop circuit 78. Consequently, the scan clock pulse generator 44 is disabled, and the auto scan is interrupted. This state can be maintained even if the switch S'1 or S'2 is released. Since the clock line 44A is maintained at the high level, the NAND gate 59 produces a positive-going output pulse in response to a negative-going output pulse from the NOR gate 62. This positive-going output pulse is differentiated by the differentiator 56 of the edge detection circuit 58. Since the inverter 57 does not respond to negative spike pulses from the differentiator 56, but only to the positive spike pulse, there may be obtained from the inverter 57 an output pulse with a narrow pulse width corresponding to the positive edge of the positive-going output pulse from the NAND gate 59. The positive edge of this narrow pulse changes the count number in the scan counters by one step. Whether the count number in the scan counters is increased or decreased depends on which of the one-step control switches is operated. If the switch S'1 is operated, the count number is increased, while if the switch S'2 is operated, then the count number if decreased.

Namely, when the one-step control switch is operated, the auto scan is interrupted, the count number in the scan counters changes by one step for every operation of the switch, and the received frequencies are manually scanned in 100 kHz step.

The delay circuits 60 and 61, edge detection circuit 58, and the OR gates 45 and 46 are provided in the auto scanner as shown in FIG. 3A for the purpose of preventing errorneous counting operations in the manual scanning which may be caused due to the nature of the scan counters 41, 42 and 43. Without these circuits, an errorneous counting will occur if the one-step control switch S'1 (up) is operated when the count number in first-stage counter 41 and/or second-stage counter 42 is 0 in the down-counting state, and if the one-step control switch S'2 (down) is operated when the count number in the first-stage counter 41 and/or second-stage counter 42 is 9 in the up-counting state. As described above, the carry-out is at the low level when the first-stage counter 41 is in the down-counting state and the count number therein is 0. When the one-step control switch S'1 (up) is operated in this state, the counter 41 is brought into the up-counting state, and the carry-out terminal turns to the high level. Unless the carry-out terminal 41c of the first-stage counter 41 and the output of the edge detection circuit 58 are coupled to the clock input terminal of the second-stage counter 42 through OR gate 45, a positive potential variation of the carry-out terminal 41c will increment the count number in the second-stage counter 42. Likewise, if the count number in the second stage counter 42 is 0, the third-stage counter 43 will increase its count number. Accordingly, if the one-step control switch S'1 is operated when the scan counters 41, 42 and 43 are in the down-counting state and the count number therein is 800, for example, there will be caused a wrong operation; the count number jumps to 911. Since the radio receiver of this invention is provided with the OR gates 45 and 46, edge detection circuit 58 and delay circuits 60 and 61, a change of the state of the carry-out terminal of preceding counter, which is caused when the one-step control switch S'1 or S'2 is operated with the count number in that counter at 0 or 9, is prevented from being transmitted to the clock input of an immediately succeeding counter.

Figure 4:
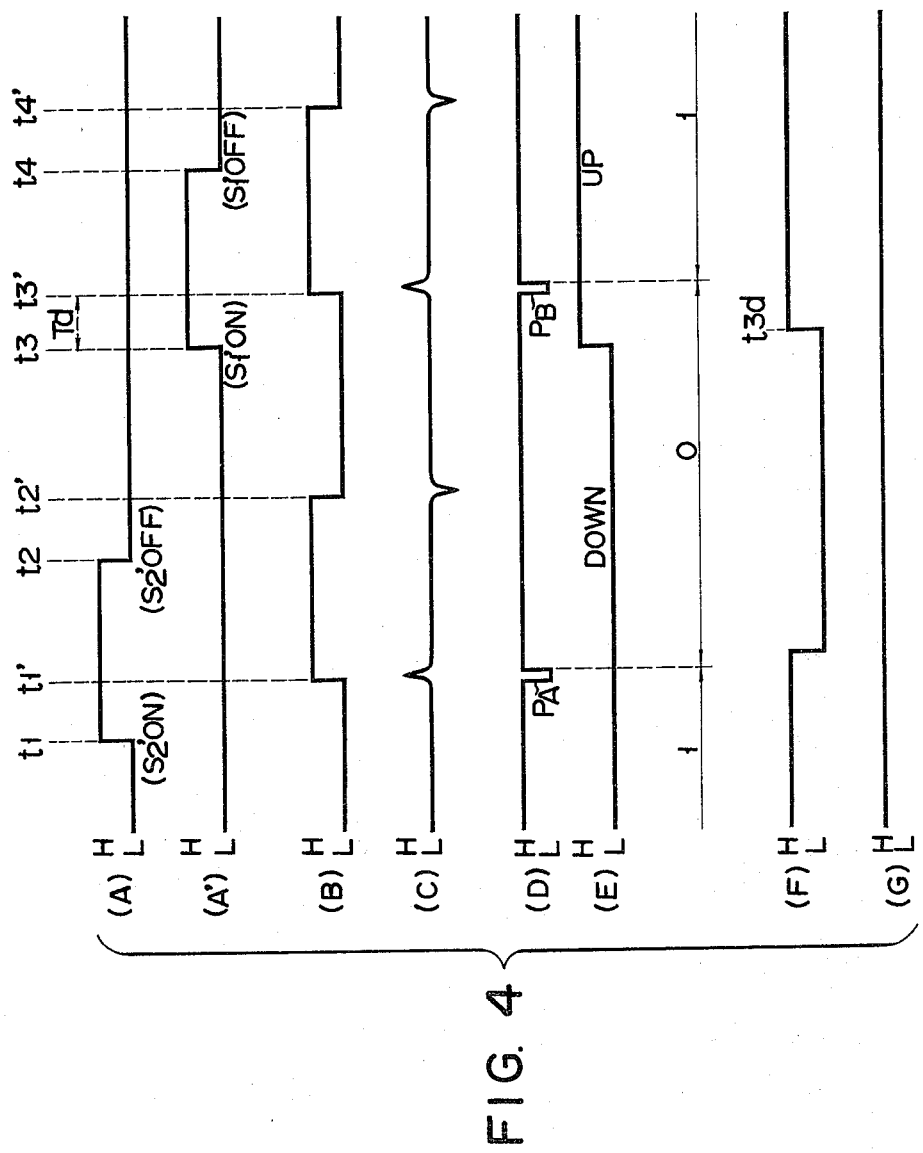
FIG. 4 shows a timing chart useful in explaining the counting operation of the scan counter of FIG. 3A.

Referring now to the timing diagram of FIG. 4, there will further be described in detail the errorfree counting operation of the scan counters when the one-step switches S'1 and S'2 are operated. As an example, let us take a case where the switch S'2 and then the switch S'1 are operated when the counters are in the down-counting state and the count number therein is 801. FIG. 4(A) shows the output signal of the switch S'2, or the input signal of the delay circuit 61, indicating that the switch S'2 is turned on (depressed) at time t1 and off (released) at time t2. FIG. 4(A') shows the output signal of the switch S'1 or the input signal of the delay circuit 60, indicating that the switch S'1 is turned on at time t3 and off at time t4. Thus, as shown in FIG. 4(B), the output signals of the switch S'1 and S'2 appear at the output of NAND gate 59 with a time delay Td provided by the delay circuits 60 and 61. At the output of the differentiation circuit 56 of the edge detection circuit 58, as shown in FIG. 4(C), appear positive and negative spike pulses corresponding to leading and trailing edges of the output pulse of the NAND gate 59, respectively. Since the inverter 57 does not respond to negative input signals, there appear at the output of the inverter 57 narrow output pulses PA and PB corresponding to the positive spike pulses, as shown in FIG. 4(D). As shown in FIG. 4(E), the up/down control input of the counters 41, 42 and 43 changes from the low to high level at time t3. In response to the positive trailing edge of the input pulse PA, the first-stage counter 41 has its count number counted down from 1 to 0. Consequently, the carry-out of the first counter 41 changes from the high to low level with some delay behind the count number change by the propagation delay time of the counter, as shown in FIG. 4(F). When the up/down control input goes high at time t3 where the count number is 0, the carry-out of the first-stage counter 41 changes from the low to high level at time t3d with the propagation delay time, as shown in FIG. 4(F). As may be seen from FIGS. 4(D) and 4(F), there exists no period in which the clock input and carry-out of the first-stage counter 41 are simultaneously at the low level. Accordingly, as shown in FIG. 4(G), the output of OR gate 45 whose inputs are connected to the clock input and carry-out of the first-stage counter 41, that is, the clock input of the second-stage counter 42 remains high without changing its state at time t3 when the counters are changed from the down-counting state to the up-counting state. Inconsequence, it will be understood that the second-stage counter 42 can prevent errorneous operation without being affected by the change of the state of the first-stage counter 41. That is, according to the aforesaid example, if the switch S'2 is operated when the counters are in the down-counting state and the count number therein is 801, the count number changes to 800. Then, the count number is changed correctly to 801 by operating the switch S'1.

Figure 5:
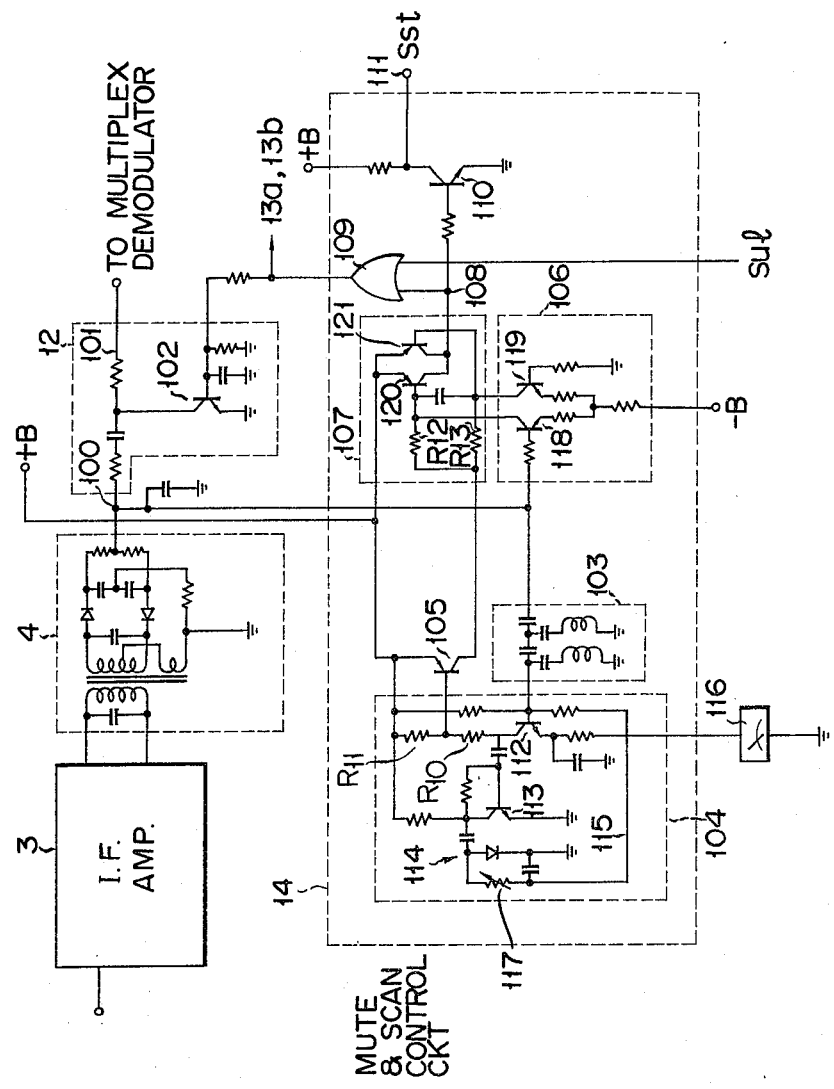
FIG. 5 is a circuit diagram showing a mute gate circuit and a mute and scan control circuit in FIG. 1.

Referring now to FIG. 5, an example of the mute and scan control circuit 14 will be described in detail. It is to be noted that the tuning meter amplifier 15 of FIG. 1 is incorporated in the mute and scan control circuit 14 of FIG. 5.

An output terminal 100 of the frequency discriminator 4 with a well-known S-shaped response is connected to the multiplex demodulator 7 through the mute gate 12. The mute gate 12 includes a transistor 102 connected between a signal transmission line 101 extending from the discriminator output 100 to the multiplex demodulator 7 and ground. Conduction of the transistor 102 connects the signal transmission line 101 to ground, thereby muting a demodulated composite signal. Other mute gates 13a and 13b may be constructed just like the mute gate 12.

The control circuit 14 connected to the output terminal 100 of the frequency discriminator 4 comprises a high-pass filter 103 for taking off high-frequency noises above the audible frequency range involved in the output signal of the frequency discriminator 4, an automatic gain-controlled amplifier 104 with its gain controlled in response to the level of noises from the high-pass filter 103, a squelch level detecting transistor 105 controlled by the automatic gain-controlled amplifier 104, a DC level detector 106 for detecting a direct-current voltage level of the demodulated output of the frequency discriminator 4, and an AND circuit 107 connected to the squelch level detecting transistor 105 and the DC level detector 106. An output 108 of the AND circuit 107 is coupled to the bases of transistors in the mute gates 12, 13a and 13b through an OR gate 109. One input of the OR gate 109 is coupled with the non-lock detection signal Sul from the non-lock detector 22. Also, the output 108 of the AND circuit 107 is connected to the base of a transistor 110 with its collector connected to an output terminal 111 for providing the station signal Sst. The output terminal 111 is connected to the station signal line 14A of the auto scan control circuit 66 (FIGS. 3B).

The automatic gain-controlled amplifier 104 includes a first-stage amplifying transistor 112, a second-stage amplifying transistor 113, a rectifier circuit 114 for rectifying the output signal of the transistor 113 to produce a negative DC voltage, and a feedback line 115 connecting the output of the rectifier circuit 114 to the base of the first-stage transistor 112. The emitter of first-stage transistor 112 is connected to ground through tuning meter 116. The rectifier circuit 114 includes a variable resistor 117 for controlling the squelch level by changing the feedback voltage to the transistor 112. In the above-mentioned arrangement of the automatic gain-controlled amplifier 104, the DC collector current of the first-stage transistor 112 decreases as the level of noises from the high-pass filter 103 increases; the DC collector current increases as the noise level decreases.

The squelch level detecting transistor 105 has its base connected to the connection point of dividing resistors R10 and R11 connected to the collector of transistor 112, and emitter connected to a power source (+B).

The DC level detector 106, which includes a transistor 118 with its base DC coupled to the output 100 of the frequency discriminator 4 and a transistor 119 with its base coupled to ground, compares the DC level of the frequency discriminator 4 with the ground potential. The transistors 118 and 119 have their emitters connected to a negative power source (−B) via a common resistor so as to function as a differential amplifier.

The AND circuit 107 includes a transistor 120 with its base connected to the collector of transistor 118 and to the collector of the squelch level detecting transistor 105 through a resistor R12, and a transistor 121 with its emitter connected to the power source (+B) and base connected to the collector of transistor 105 via a resistor R13. The collectors of transistors 120 and 121 are connected together to the output terminal 108 of the AND circuit 107.

In operation of the mute and scan control circuit, when the phase-locked loop frequency synthesizer is detuned during the automatic scanning, the level of high-frequency noises appearing at the output of the frequency discriminator 4 is considerably high. Therefore, in the automatic gain-controlled amplifier 104, the level of the negative DC voltage fed from the rectifier circuit 114 back to the first-stage transistor 112 increases, thereby reducing the DC collector current of the first-stage transistor 112. The reduction in the collector current of transistor 112 decreases a voltage drop across the resistor R11, that is, the emitter-to-base forward bias voltage of the transistor 105, reducing the collector current of the transistor 105 and thus the collector currents of the transistors 118 and 119. As a result, the base potentials of the transistors 120 and 121 of the AND circuit 107 drop, allowing at least one of the transistors 120 and 121 to conduct. Accordingly, the voltage at the output 108 of the AND circuit 107 is raised to cause the transistors 102 and 110 to conduct. The output of frequency discriminator 4 is muted by conduction of the transistor 102. By conduction of the transistor 110, the station signal line 14A of FIG. 3B remains low, so that the scan clock pulse generator 44 is not brought into a quiescent state, allowing the automatic scanning to be continued.

When the frequency synthesizer has approached to but not completely locked to a broadcast signal yet, the output noise level of the frequency discriminator 4 is reduced to increase the collector current of transistor 105. Consequently, the base potentials of the transistors 120 and 121 of the AND circuit 107 increase. When the frequency synthesizer is not completely tuned, however, the DC level of the frequency discriminator 4 is biased from the zero potential due to the S-shaped response thereof, so that the base potentials of the transistors 118 and 119 of the DC level detector 106 varies from each other. If the DC level of the frequency discriminator 4 is positive, the collector current of the transistor 118 is larger than that of the transistor 119, so that the base potential of transistor 120 is reduced as compared with that of the transistor 121, causing the transistor 120 to conduct. Thus, even if the noise level is decreased, the mute operation and automatic scanning are continued until the synthesizer is completely locked to the broadcast signal.

When the frequency synthesizer is completely tuned to the broadcast signal, the high-frequency noise level is further decreased, and the DC level of the frequency discriminator output is reduced to zero, whereby the base potential of one transistor, e.g. transistor 120 as described above, that has so far been in conduction increases to turn it off. Thereupon, the other transistor 121 has already been rendered nonconducting, so that the base potentials of the transistors 102 and 110 drop to turn them off. Consequently, the output signal of the frequency discriminator 4 is transmitted to the multiplex demodulator 7 and the station signal Sst is developed to interrupt the automatic scanning.

Meanwhile, if the broadcast signal is low in intensity although the receiver is tuned to the broadcast signal, the high-frequency noise level is relatively high, and the collector current of the squelch level detecting transistor 105 is small, the transistors 120 and 121 being maintained in conduction. Thus, the muting of the demodulated signal and the auto scan are continued. The minimum level of the broadcast input signal to stop the auto scan and to transmit the demodulated signal may be adjusted by means of the variable resistor 117 of the automatic gain-controlled amplifier 104. Even for the same noise level, the collector current of the squelch level detecting transistor 105 may be varied by adjusting the variable resistor 117, so that the collector potential of the transistors 118 and 119 supplied with the same DC potential, that is, the base potential of transistors 120 and 121 to turn off the same can be changed. If the variable resistor 117 is so adjusted as to drop the feedback voltage to the transistor 112, for example, the minimum input level of the incoming broadcast signal to be received is reduced to increase the reception sensitivity. On the other hand, if the variable resistor 117 is so adjusted as to increase the feedback voltage, then the minimum input level is raised, allowing only high-intensity broadcast signals to be received Moreover, the OR circuit 109 is coupled with the output of the non-lock detector 12, so that the mute gates 12, 13a and 13b can mute signals even when the phase-locked loop is unstable.

In the embodiment of this invention as described above, the scan clock pulse generator is so arranged as to be disabled by the operation of the one-step control switches. It is to be understood, however, that, alternatively a gate means disabled by the operation of the one-step control switches may be provided in a clock signal transmission path extending from the scan clock generator to the scan counter.

Although there has been described with reference to the accompanying drawings an embodiment which is so constructed as to suit the FM broadcasting system in Japan, it may be easy for one skilled in the art to modify the illustrated embodiment so as to be suited for the FM broadcasting system in the USA. In the USA, as stated before, the assigned FM frequency band covers from 88.0 MHz to 108.0 MHz, and the local oscillator frequency is selected to be 10.7 MHz higher than the received frequency, thus ranging from 98.7 MHz to 118.7 MHz. Accordingly, broadcast signals within a predetermined frequency band can be received with the preset value to the programmable counter ranging from 880 to 1080 by forming the programmable counter and scan counter from 4-stage counters, and by setting the down-count limit value No of the programmable counter at 9895 (9893≡ −107) (at this count value No, the output of the NAND gate 37 of FIG. 2 turns to the low level) and the upper and lower limit values of the scan counters at 1080 and 880, respectively. By thus constructing the programmable counter and the scan counters and setting the dividing factor of the prescaler 16 of FIG. 1 at 8 or the output frequency free of the reference oscillator at 50 kHz, the phase-locked loop frequency synthesizer is allowed to scan channels in 200-kHz steps over the range of 88.0 MHz to 108.0 MHz. The preset value in the scan counter when the power is switched on may be, for example, 1001.

What we claim is:

1. An automatic frequency scanning FM radio receiver comprising:
   a phase-locked loop frequency synthesizer acting as a local oscillator circuit tunable to different radio frequencies and having a voltage-controlled oscillator, a programmable counter for dividing the output frequency of said voltage-controlled oscillator, the dividing factor of said programmable counter being changeable in integral steps by a program input code signal applied thereto, a reference oscillator, a phase comparator for comparing in phase an output signal of said reference oscillator with an output signal of said programmable counter, and a loop filter connected between an output of said phase comparator and a control input of said voltage-controlled oscillator, the output frequency of said voltage-controlled oscillator being changed in steps in response to change in the dividing factor of said programmable counter provided by the program input signal;
   a mixer circuit coupled to said voltage-controlled oscillator for mixing an incoming radio frequency signal with the output signal of said voltage-controlled oscillator to produce an intermediate-frequency FM signal;
   a scan clock pulse source;
   scan counter means coupled to said scan clock pulse source for counting scan clock pulses to supply said programmable counter with the program input code signal whose code numbers change in integral steps, whereby said frequency synthesizer is caused automatically to scan channels having frequencies corresponding to the code numbers within a radiobroadcasting frequency band, said scan counter means comprising an up/down counter;
   a tuning detection means for detecting that the receiver is tuned to a broadcast signal having an input level above a predetermined level, said tuning detection means comprising a frequency discriminator connected to receive the intermediate-frequency FM signal, a first circuit means for detecting the level of noise appearing at the output of said frequency discriminator, a second circuit means for detecting the level of a direct-current voltage indicating the degree of tuning of the receiver which appears at the output of said frequency discriminator, and a third circuit means producing a control signal to disable said scan clock pulse source from producing the scan clock pulses when the noise level detected by said first circuit means is below a squelch level and the DC output level of said frequency discriminator detected by said second circuit means indicates that the receiver is completely tuned;
   means for disabling said scan clock pulse source from producing the scan clock pulses when the receiver is completely tuned to said broadcast signal in response to said control signal of said tuning detection means;
   one-step manual scanning control switch means connected to said scan counter means and to said disabling means for disabling the scan clock pulse source from producing the scan clock pulses, said one-step manual scanning control switch means, when operated, actuating said disabling means and changing the count number in said scan counter means by one step for each operation thereof, and having a first switch for increasing the count number in said scan counter means by one step for each operation thereof and a second switch for decreasing said count number by one step for each operation thereof; and
   a control means for reversing the counting direction of said up/down counter when the count number in said up/down counter attains a value corresponding to the minimum frequency in said frequency band.

2. The automatic frequency acanning radio receiver according to claim 1 further including means for presetting, when a power supply is turned on, said scanning counter means at such a value as to cause said frequency synthesizer to tune to a predetermined frequency within a radiobroadcasting frequency band.

3. The automatic frequency scanning radio receiver according to claim 1 further including switch means connected to said control means for manually reversing the counting direction of said scan counter means.

4. The automatic frequency scanning radio receiver according to claim 1 further including automatic scanning control switch means for resuming the scan clock pulse counting of said scan counter means after the counting operation of said counter means is disabled by said disabling means, said automatic scanning control switch means having third and fourth switches for setting the counting direction of said scan counter means to up and down directions, respectively.

5. The automatic frequency scanning radio receiver according to claim 1 further including mute gate means provided in a signal transmission path connected to the output side of said frequency discriminator and interrupting said signal transmission path on at least one of the conditions that said tuning detection means is not detecting the receiver completely tuned and that said phase-locked loop frequency synthesizer is detuned when the output signal of said programmable counter is out of phase with the output signal of said reference oscillator.

6. The automatic frequency scanning radio receiver according to claim 1, wherein said tuning detection means further comprises means for adjusting said squelch level of said noise.

7. An automatic frequency scanning FM radio receiver comprising:
- a phase-locked loop frequency synthesizer acting as a local oscillator circuit tunable to different radio frequencies and having a voltage-controlled oscillator, a programmable counter for dividing the output frequency of said voltage-controlled oscillator, the dividing factor of said programmable counter being changeable in integral steps by a program input code signal applied thereto, a reference oscillator, a phase comparator for comparing in phase an output signal of said reference oscillator with an output signal of said programmable counter, and a loop filter connected between an output of said phase comparator and a control input of said voltage-controlled oscillator, the output frequency of said voltage-controlled oscillator being changed in steps in response to change in the dividing factor of said programmable counter provided by the program input signal;
- a mixer circuit coupled to said voltage-controlled oscillator for mixing an incoming radio frequency signal with the output signal of said voltage-controlled oscillator to produce an intermediate-frequency FM signal;
- a scan clock pulse source;
- scan counter means coupled to said scan clock pulse source for counting scan clock pulses to supply said programmable counter with the program input code signal whose code numbers change in integral steps, whereby said frequency synthesizer is caused automatically to scan channels having frequencies corresponding to the code numbers within a radio-broadcasting frequency band;
- a frequency discriminator connected to receive the intermediate-frequency FM signal;
- a tuning detection means connected to the output of said frequency discriminator for detecting that the receiver is tuned to a broadcast signal having an input level above a predetermined level;
- means responsive to said tuning detection means to interrupt the scan clock pulse counting of said scan counter means when the receiver is tuned to said broadcast signal;
- manual one-step control switch circuit means which includes a control switch for producing a one-step control signal for each operation of a manual one-step control switch;
- delay circuit means connected to receive said one-step control signal to produce a delayed one-step control signal; and
- edge detection circuit means responsive to said delayed one-step control signal to produce a one-step control pulse corresponding to a predetermined edge of said delayed control signal; and
- wherein said scan counter means includes a plurality of decade counter stages each having a clock input and a carry output, said clock input and carry output of each decade counter stage being coupled to said clock input of an immediately succeeding counter stage, and said clock input of a first counter stage being coupled to said edge detection circuit means to receive said one-step control pulse.

* * * * *